United States Patent
Gomm et al.

(10) Patent No.: US 6,728,163 B2
(45) Date of Patent: Apr. 27, 2004

(54) CONTROLLING A DELAY LOCK LOOP CIRCUIT

(75) Inventors: Tyler J. Gomm, Meridian, ID (US); Ross E. Dermott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/226,782

(22) Filed: Aug. 23, 2002

(65) Prior Publication Data

US 2004/0037159 A1 Feb. 26, 2004

(51) Int. Cl.[7] .............................. G11C 7/00; G11C 8/00
(52) U.S. Cl. ..................... 365/233; 365/236; 365/194
(58) Field of Search ................................. 327/141, 155, 327/156, 158, 159, 160, 161; 365/233, 236, 194

(56) References Cited

U.S. PATENT DOCUMENTS 6,166,573 A * 12/2000 Moore et al. ............... 327/161
6,330,197 B1 * 12/2001 Currin et al. ............... 365/194
6,388,485 B2 * 5/2002 Kim ........................... 327/161
6,417,706 B2 * 7/2002 Kondo ........................ 327/158
6,441,662 B2 * 8/2002 Ikeda ......................... 327/160
6,480,047 B2 * 11/2002 Abdel-Maguid et al. .... 327/159
6,483,359 B2 * 11/2002 Lee ............................ 327/158
6,549,051 B1 * 4/2003 Di Veroli et al. ........... 327/161

* cited by examiner

*Primary Examiner*—Trong Phan
(74) *Attorney, Agent, or Firm*—Williams, Morgan, & Amerson, P.C.

(57) ABSTRACT

A method and apparatus is provided for performing a filter control of a delay lock loop circuit. A coarse delay and/or a fine delay are implemented upon a reference signal based upon a phase shift between the reference signal and a feedback signal. A synchronized output signal is generated based upon the coarse delay and the fine delay. The apparatus of the present invention includes a delay lock loop to provide an output signal based upon a phase difference between a reference signal and a feedback signal. The delay lock loop comprises a filter to provide a filter response to the phase difference. The filter response is capable of providing a coarse delay and/or a fine delay.

64 Claims, 9 Drawing Sheets

CONTROLLING A DELAY LOCK LOOP CIRCUIT

BACKGROUND OF THE INVENTION

1. Field of the Invention

This invention generally relates to a semiconductor memory device, and, in particular, to a majority filter control of a delay lock loop.

2. Description of the Related Art

Modem integrated circuit devices are comprised of millions of semiconductor devices, e.g., transistors, formed above a semiconductor substrate, such as silicon. These devices are very densely packed, i.e., there is little space between them. Similarly densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selection one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256 K ($2^{18}$) memory cells.

Flash memory (sometimes called "flash RAM") is a type of non-volatile memory that can be erased and reprogrammed in units of memory called blocks. Other types of memory may be erased and rewritten in smaller units, such as units at the byte level, which is more flexible, but slower than the block operations of flash memory. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices.

Although forming the selected electrical connections may enable the circuits to perform their intended functions, undesirable electrical connections may result in a variety of malfunctions, e.g., short circuit paths may be established. Thus, semiconductor devices, such as the capacitors in memory cells, and conducting lines, such as the input/output lines, may generally be electrically isolated. For example, to ensure that devices, lines, and/or groups thereof, that form the semiconductor memory, are properly isolated, modem semiconductor processing involves the formation of shallow trench isolations (STI) in various regions of the substrate. These shallow trench isolations are typically formed by etching a trench in the semiconductor substrate and, thereafter, filling the trench with an isolation material, e.g., an insulator, such as silicon dioxide, silicon oxynitride, silicon nitride, or other like materials. However, it may be difficult to completely isolate the devices and/or lines. For example, defects in the semiconductor substrate or in the manufacturing process may form an undesirable conducting path between the devices and/or lines in the semiconductor memory that may cause the semiconductor memory to malfunction.

Typically, digital systems, such as memory systems, may comprise a delay lock loop that may be used to align the edges of a plurality of digital signals. For example, a delay lock loop circuit may be used to align the rising edge and/or the falling edge of a clock signal based upon a reference clock signal, to produce a synchronized clock signal. Many times, digital signals from multiple sources access one or more memory spaces in a memory, unit. It is desirable that these digital signals be synchronized for proper access of memory. Typical delay lock loops comprise a phase detect unit that detects the phase differences between a plurality of signals. The output of the phase detect unit is then used to affect the operation of a filter that adjusts the delay of an output of the delay lock loop.

The problems associated with the current methodologies of implementing the delay lock loop include an overreaction when performing delay compensation due to external factors on a digital line. These external factors that cause inadvertent adjustments of the delay lock loop include a noise spike on a bus or a control signal. These noise spikes may cause a delay lock loop circuit to be over-dynamic, wherein the delay lock loop circuit tracks a noise spike, thereby adding unintentional delays to the line.

The present invention is directed to overcoming, or at least reducing, the effects of, one or more of the problems set forth above.

SUMMARY OF THE INVENTION

In one aspect of the instant invention, a device is provided to perform a filter control of a delay lock loop circuit. The device of the present invention includes a delay lock loop to provide an output signal based upon a phase difference between a reference signal and a feedback signal. The delay lock loop includes a filter to provide a filter response to the phase difference. The filter response is capable of providing a coarse delay and/or a fine delay.

In another aspect of the instant invention, a delay lock loop is provided to perform a delay function upon a signal. The delay lock loop of the present invention includes a forward path comprising an input path for receiving a reference signal and a delay path for providing at least one of a coarse delay and a fine delay upon the reference signal to provide an output signal. The delay lock loop of the present invention also includes: a feedback path to provide a feedback signal based upon the output signal; a phase detector to generate a shift signal based upon a phase comparison of the feedback signal and the reference signal; and a filter to receive the shift signal from the phase detector and provide at least one of a fine delay signal and a coarse delay signal for generating the output signal.

In another aspect of the instant invention, a circuit is provided to perform a filter control of a delay lock loop circuit. The circuit of the present invention comprises: a first delay unit to receive a reference signal and provide a delay upon the reference signal; a filter to apply a second delay upon the reference signal to generate an output signal; a feedback delay unit to provide a delay upon the output signal to generate a feedback signal; and a phase detector to determine a phase difference between the reference signal and the feedback signal and generate a shift signal.

In yet another aspect of the instant invention, a system board is provided for performing a filter control of a delay lock loop circuit. The system board of the present invention comprises a first device and a second device. The first device includes a memory location for storing data and a delay lock loop to provide an output signal based upon a phase difference between a reference signal and a feedback signal. The delay lock loop includes a filter to provide a filter response to the phase difference. The filter response includes providing at least one of a coarse delay and a fine delay. The second device is operatively coupled to the first device. The second device is adapted to access data from the first device based upon an operation performed by the delay lock loop.

In yet another of the instant invention, a memory device, which is capable of performing a filter control of a delay lock loop circuit, is provided. The memory device of the present invention includes delay lock loop to provide an output signal based upon a phase difference between a reference signal and a feedback signal. The delay lock loop includes a filter to provide a filter response to the phase difference. The filter response includes providing at least one of a coarse delay and a fine delay.

In another aspect of the instant invention, a method is provided for performing a filter control of a delay lock loop circuit. A coarse delay and/or a fine delay are implemented upon a reference signal based upon a phase shift between the reference signal and a feedback signal. A synchronized output signal is generated based upon the coarse delay and the fine delay.

In yet another aspect of the present invention, a computer readable program storage device encoded with instructions is provided for performing delay function upon a signal. A computer readable program storage device encoded with instructions that, when executed by a computer, performs a method, which comprises: providing at least one of a coarse delay and a fine delay upon a reference signal based upon a phase shift between the reference signal and a feedback signal; and generating a synchronized output signal based upon the coarse delay and the fine delay.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Synchronization between multiple digital signals in a digital system is important for accurate exchange of digital data. Often, delay lock loops are employed to synchronize digital signals. However, without a signal filtering system, the delay lock loop may cause overreaction to external factors, such as noise spikes on a digital line. This overreaction may compromise the accuracy of the performance of the delay lock loop. Embodiments of the present invention provide for a filtering system to reduce an overreaction to external factors on a digital line, such as noise, in a delay lock loop circuit. A fine delay adjustment to adjust a delay on a delay lock loop circuit is provided. Embodiments of the present invention provide for utilizing the contents of a majority filter to perform a fine delay adjustment to a delay line to supplement a more coarse adjustment provided by a phase detect circuit in the delay lock loop circuit. Therefore, a qualified shift signal is provided to perform a more accurate adjustment to a delay line.

Embodiments of the present invention provide for making a decision based upon a determination whether to perform a delay adjustment, such as a fine delay adjustment, even if a coarse adjustment is required. In other words, the majority filter for adjusting delays in the delay lock loop circuit is provided with the ability to perform different amounts of fine delay adjustments. Although embodiments of the present invention are described in the context of memory devices, the concepts taught by embodiments of the present invention may be implemented in a variety of digital systems.

Figure 1:
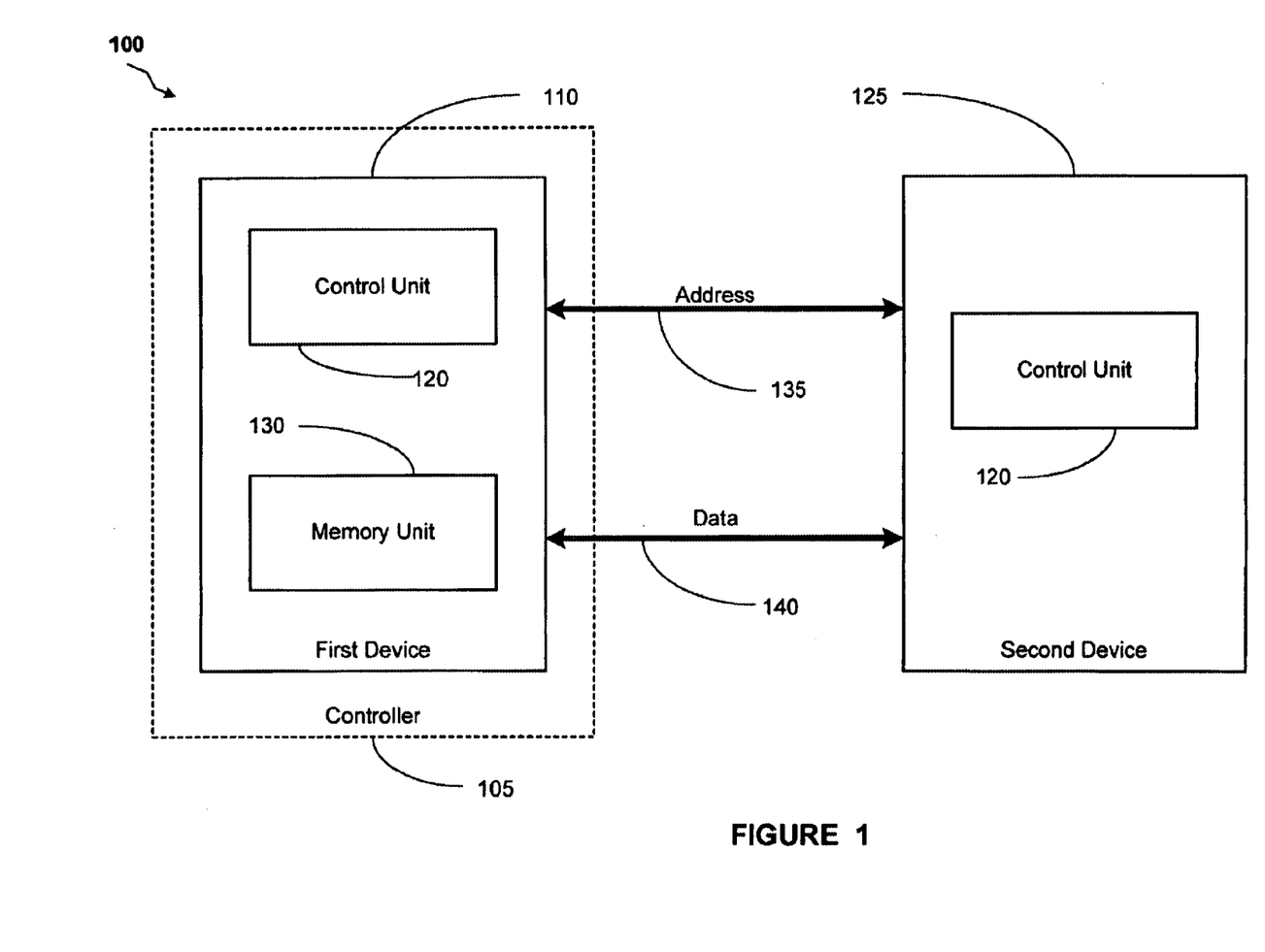
FIG. 1 is a block diagram of a system including a device that is capable of accessing digital signals, in accordance with one embodiment of the present invention.

Referring to FIG. 1, a block diagram of a system 100 is illustrated, in accordance with one embodiment of the present invention. The system 100 comprises a first device 110, which, in one embodiment, may comprise a memory unit 130 capable of storing data. In one embodiment, the memory unit 130 may be a dynamic random access memory (DRAM), a static random access memory (SRAM), a double-data rate synchronous DRAM (DDR SDRAM), a Rambus™ DRAM (RDRAM), a FLASH memory unit, or the like. The first device 110 may be encompassed by a controller 105. In one embodiment, the controller 105 may be a memory controller, a computer system, such as a PC-computer, and the like. In one embodiment, the controller 105 may be a system board, such as a motherboard for a computer system. The first device 110 may be accessed by a second device 125, which, in one embodiment, may be an accessing/access device. The second device 125 may send addresses on a line 135 to the first device 110. The first device 110 may then provide data to the second device 125 on a line 140. The first and second devices 110, 125 may comprise a control unit 120 capable of accessing data (including code) stored in the memory unit 130 of the first device 110. The second device 125 may he any device that uses the first device 110 to store data, read data, or both. Examples of the second device 125 may include, but are not limited to, a computer, a camera, a telephone, a television, a radio, a calculator, a personal digital assistant, a network switch, and the like.

The control unit 120, in one embodiment, may manage the overall operations of the second device 125, including writing and reading data to and from the first device 110. The control unit 120 may comprise a microprocessor, a microcontroller, a digital signal processor, a processor card (including one or more microprocessors or controllers), a memory controller, or other control or computing devices.

In one embodiment, the first device 110 may be a memory chip device, such as a DRAM device, an SRAM device, a FLASH memory device, and the like. In one embodiment, the first device 110 may be a memory chip device that may be implemented into a digital system, such as a computer system. In an alternative embodiment; the first device 110 may be an external memory, such as a memory stick, and may be accessed when inserted into a slot (not shown) of the second device 125. When inserted into the slot, the second device 125 may provide the appropriate power and control signals to access memory locations in the first device 110. The first device 110 may be external to, or internal (e.g., integrated) to, the second device 125. The second device 125, which may be a computer system, may employ a first device 110 (in the form of a memory unit) that is integrated within the computer system to store data (e.g., BIOS [basic input/output system]) related to the computer system.

Figure 2:
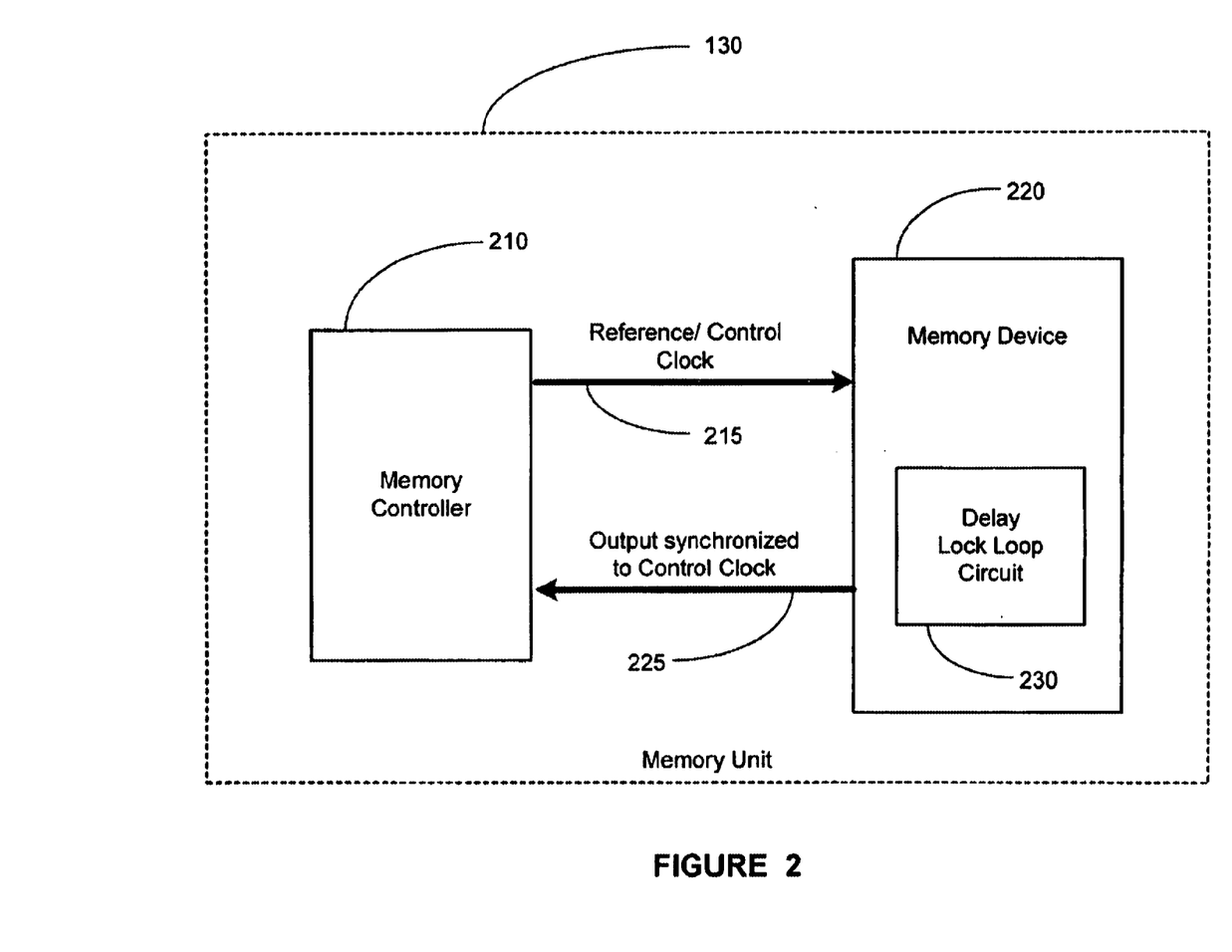
FIG. 2 is a more detailed block diagram representation of the memory unit of FIG. 1, in accordance with one illustrative embodiment of the present invention.

Turning now to FIG. 2, a more detailed block diagram depiction of the memory unit 130 in accordance with one illustrative embodiment of the present invention is provided. In one embodiment, the memory unit 130 comprises a memory controller 210, which is operatively coupled to one or more memory devices 220. The memory controller 210 may comprise circuitry that provides access (e.g., such as storing and extracting data to and from the memory devices 220) to control operations of the memory unit 130. The memory device 220 may be an array of memory storing modules that are capable of storing data.

Proper timing of the data signals carrying data from the memory device 220 is useful in extracting data accurately. For example, if the period of the control clock is 5 nanoseconds, and the data is to be sent or received on every clock edge of the control clock 215 (e.g., as in the case of a double data rate [DDR SDRAM]) then there is a 2.5 nanosecond maximum timing window available to send or receive the data. Therefore, a delay lock loop may be employed to synchronize various digital signals (e.g., operation clocks, data signals, etc.) to ensure that data access is performed within acceptable timing windows.

In one embodiment, the memory device 220 may comprise a delay lock loop circuit 230. In alternative embodiments, the delay lock loop circuit 230 may reside in other portions of the memory unit 130, such as in the memory controller 210. The delay lock loop circuit 230 is capable of locking a plurality of digital signals based upon a reference or a control clock on a line 215. A delay generated by the delay lock loop circuit 230, which may be used to synchronize the output signal carrying data from the memory device 220 to an external clock, such as a control clock derived from a system clock. The memory device 220 is capable of providing one or more output signals to the memory controller 210 based upon a reference or control clock received by the memory device 220. The reference/control clock may be generated by the memory controller 210 and/or from a component external to the memory unit 130, such as the control unit 120.

In one embodiment, the memory device 220 receives a control clock on a line 215 from the memory controller 210. The delay lock loop circuit 230 is capable of utilizing the control clock on the line 215 and providing an output synchronized to the control clock on a line 225. The memory controller 210 may use the output that is synchronized to the control clock on the line 215 to supply data to outside sources, such as the second device 125 and/or various components associated with the first device 110. Improvements in delay lock loop synchronization of digital signals may result in more accurate and efficient storing and/or extraction Of data to and from the memory device 220. The delay lock loop circuit 230 is capable of aligning the input edges and/or the output edges of various digital signals based upon the control clock on the line 215. The delay lock loop circuit 230 is capable of performing a phase detect function based upon the control clock on the line 215, creating a feedback loop to lock the edges of a plurality of digital signals. Using the delay lock loop circuit 230, multiple signals may be synchronized for effective and accurate transmission of data.

Figure 3:
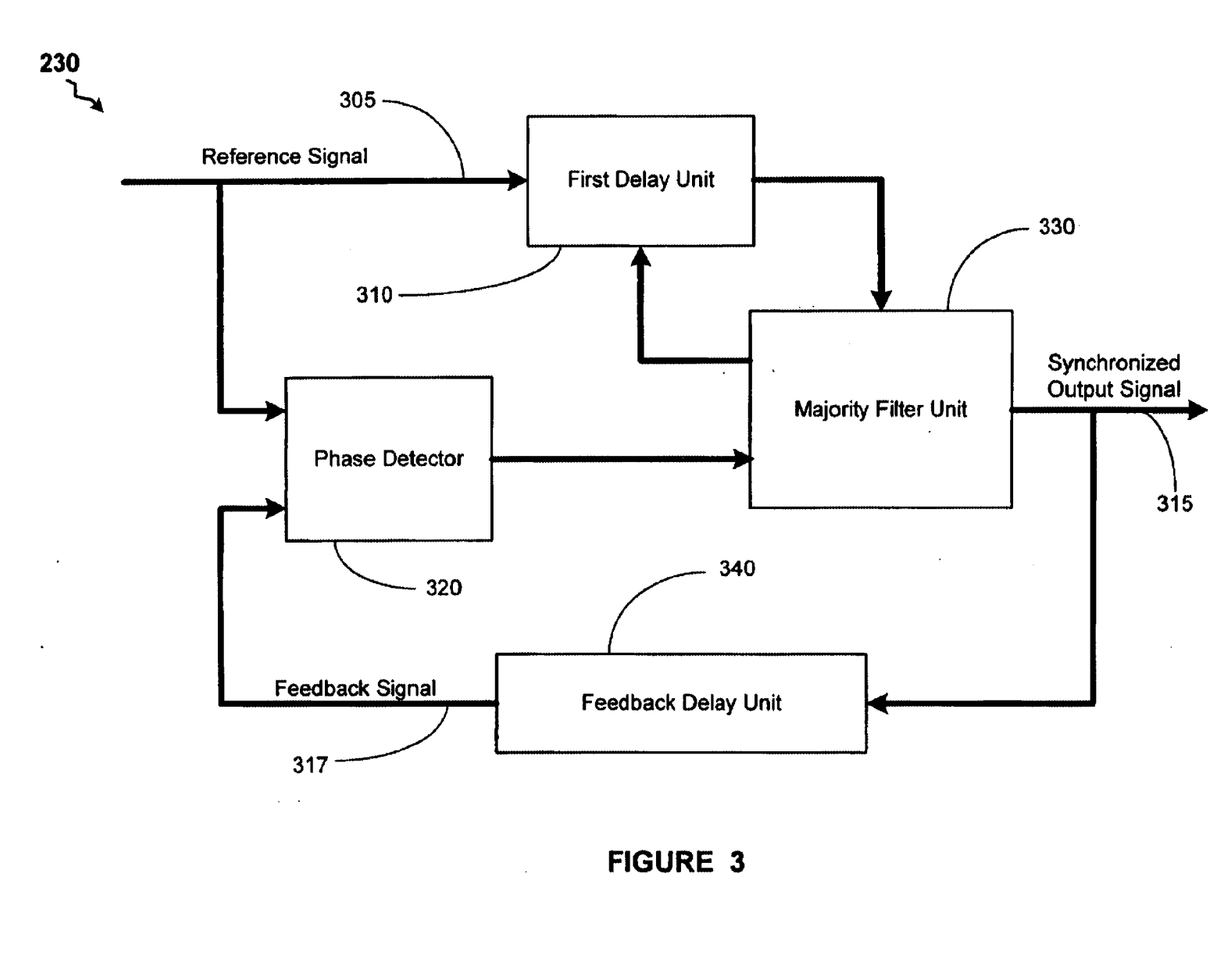
FIG. 3 illustrates a block diagram representation of a delay lock loop circuit of FIG. 2, in accordance with one illustrative embodiment of the present invention.

Turning now to FIG. 3, a more detailed description of the delay lock loop circuit 230 is illustrated. In one embodiment, the delay lock loop circuit 230 comprises a first delay unit 310, a feedback delay unit 340, a phase detector 320, and a majority filter unit 330. The first delay unit 310 provides a delay based upon a reference clock, which may be the control clock on the line 215. In one embodiment, the first delay unit 310 implements a coarse delay adjustment, as compared to a fine delay adjustment that is described below, onto the reference signal (e.g., a reference clock signal) on a line 305. The signal delayed by the first delay unit 310 is provided to the majority filter unit 330, which is described in more detail below. The majority filter unit 330 may then add additional delay and provide a synchronized digital output signal on a line 315. The first delay unit 310 may be capable of adding different delay components to a signal based upon independent control signals.

The feedback delay unit 340 provides a feedback delay for the phase detector 320 on a line 317. In one embodiment, the synchronized output signal on the line 315 is delayed by the feedback delay unit 340. The phase detector 320 detects a phase difference between the reference signal on the line 305 and the signal from the feedback delay unit 340 on the line 317. The phase detector 320 provides a signal that indicates the phase difference between the reference lock and the feedback clock on the line 317 to the majority filter unit 330. The majority filter unit 330 provides a delay signal to the first delay unit 310, which maybe based upon an output from the phase detector 320 and/or a fine delay generated by the majority filter unit 330. The majority filter unit 330 may also generate the synchronized output signal on the line 315.

The output of the delay lock loop circuit 230 provides a synchronized output on the line 315 for providing synchronized extraction of data to and from the memory device 220. Generally, the delay lock loop circuit 230 provides a first order control system that is generally stable and does not generally accumulate substantial phase error. The absence of significant phase error may be due to the elimination of a voltage control oscillator, which may cause jitter(s) in the resulting transfer function. Furthermore, as compared to a voltage control oscillator, the delay lock loop is generally not a frequency synthesizer and is typically more immune to noise.

In one embodiment, the majority filter unit 330 provides a qualified shift (an increase or decrease in delay) that is applied to the reference clock 215 by the first delay unit 310. The majority filter unit 330, in one embodiment, is a moving average filter. In one embodiment, the majority filter unit 330 may behave as a low pass filter. A more detailed illustration and description of the majority filter unit 330 is provided in FIG. 4 and accompanying description below.

Figure 4:
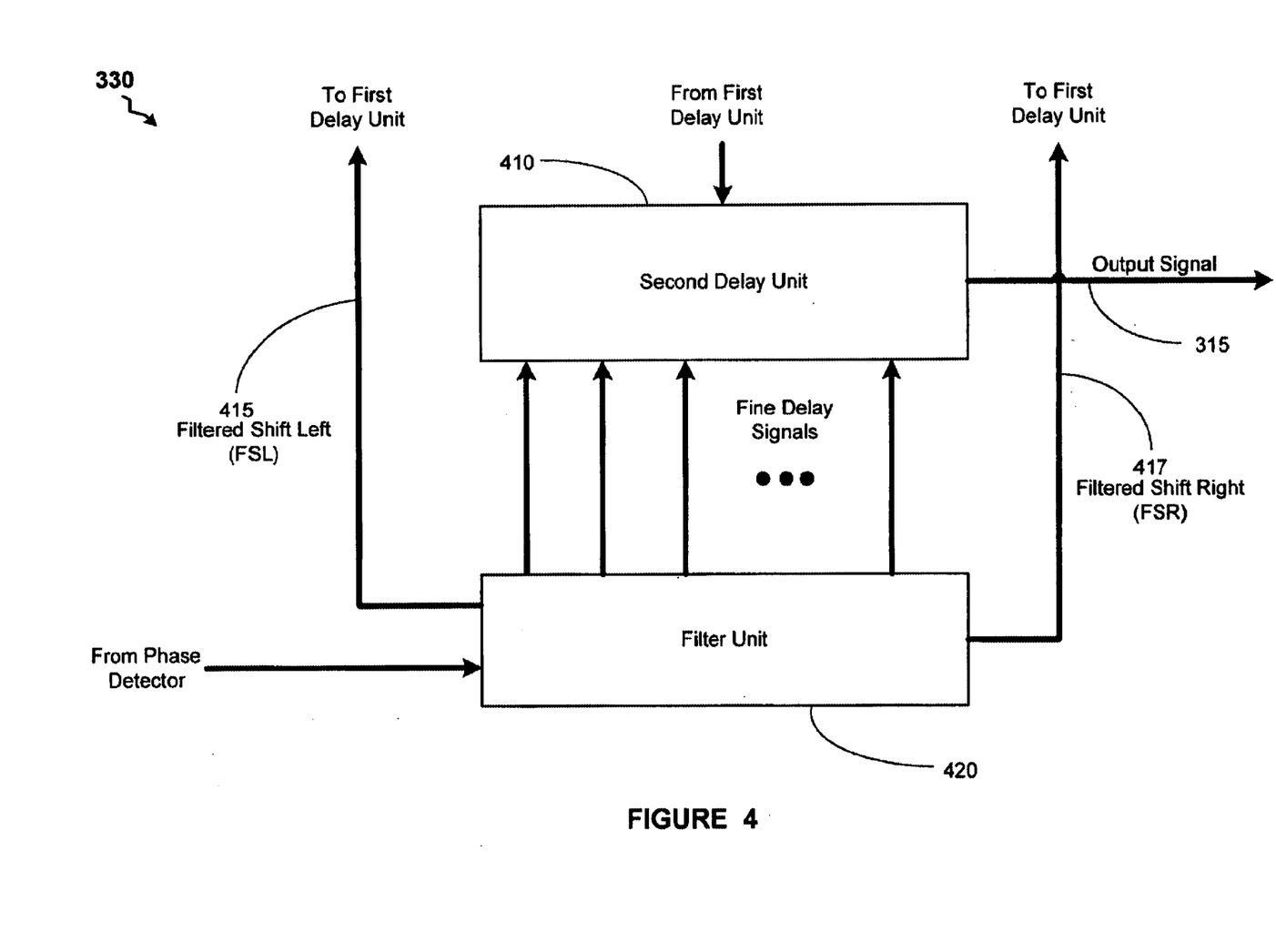
FIG. 4 is a more detailed block diagram representation of the majority filter unit of FIG. 3, in accordance with one illustrative embodiment of the present invention.

Turning now to FIG. 4, a block diagram depiction of the majority filter unit 330 is illustrated. The majority filter unit 330 comprises a second delay unit 410 and a filter unit 420. Data from the phase detector 320 is filtered by the filter unit 420, which, in one embodiment, is a low pass filter. The filter unit 420 provides one or more signals to the second delay unit 410. The signals from the filter unit 420 relate to fine delay (as compared to the coarse delay implemented by the first delay unit 310) that may be implemented onto the signal from the first delay unit 310. The second delay unit 410 provides signals to the first delay unit 310 to affect delay implemented onto the reference signal on the line 305.

The filter unit 420 may provide a filtered shift left (FSL) signal on a line 415 and/or a filtered shift right (FSR) signal on a line 417 to the first delay unit 310. In one embodiment, the FSL and the FSR signals on the lines 415, 417 provide coarse delay data to the first delay unit 310. The FSL and the FSR signals on the lines 415, 417 are based upon signals (described in more detail below) sent from the phase detector 320. Signals from the phase detector 320 may prompt a plurality of fine delay adjustment signals to be generated by the filter unit 420. After generating a predetermined number of fine delay adjustment signals, the filter unit 420 will generate the FSL and the FSR signals on the lines 415, 417, which may prompt the first delay unit 310 to implement a coarse delay adjustment.

The FSL signal 415 may prompt the first delay unit 310 to implement a shift to the left (add delay; a positive phase movement) onto the reference signal from the line 305. The FSR signal on the line 417 may prompt the first delay unit 310 to implement a shift to the right (remove delay: a negative phase movement) onto the reference signal from the line 305. The shifting in the timing of the reference signal from the line 305 is performed to synchronize a plurality of digital signals, for more accurate transmission of digital signals.

The filter unit 420 may also provide fine delay data to the second delay unit 410, which provides a fine delay adjustment signal to the first delay unit 310. The fine delay adjustment signals may cause incremental delay and/or phase corrections to be implemented to the conditioned signal from the first delay unit 310. Therefore, a single event (e.g., a noise spike) that may prompt the phase detector 320 to generate a correction signal is filtered by the majority filter unit 330. Utilizing embodiments of the present invention, the single event may cause a slight delay to be added to the synchronized signal on the line 315, however the delay lock loop circuit 230 is kept from erroneously tracking the single event with a larger coarse movement.

Additionally, if several events that prompt the phase detector 320 to generate phase correction signals are present, the filter unit 420 will generate the FSL or the FSR signals on the lines 415, 417 to compensate for the multiple events. The threshold, after which the coarse delay may be favored over a number of fine delays, may be predetermined and programmed into the filter unit 420. The combination of the coarse delay from the first delay unit 310 and the fine delay provided by the second delay unit 410 is used to generate the synchronized output signal on the line 315, which is more accurate than if the synchronized output signal on the line 315 were generated by simply using the coarse delay by itself.

Figure 5:
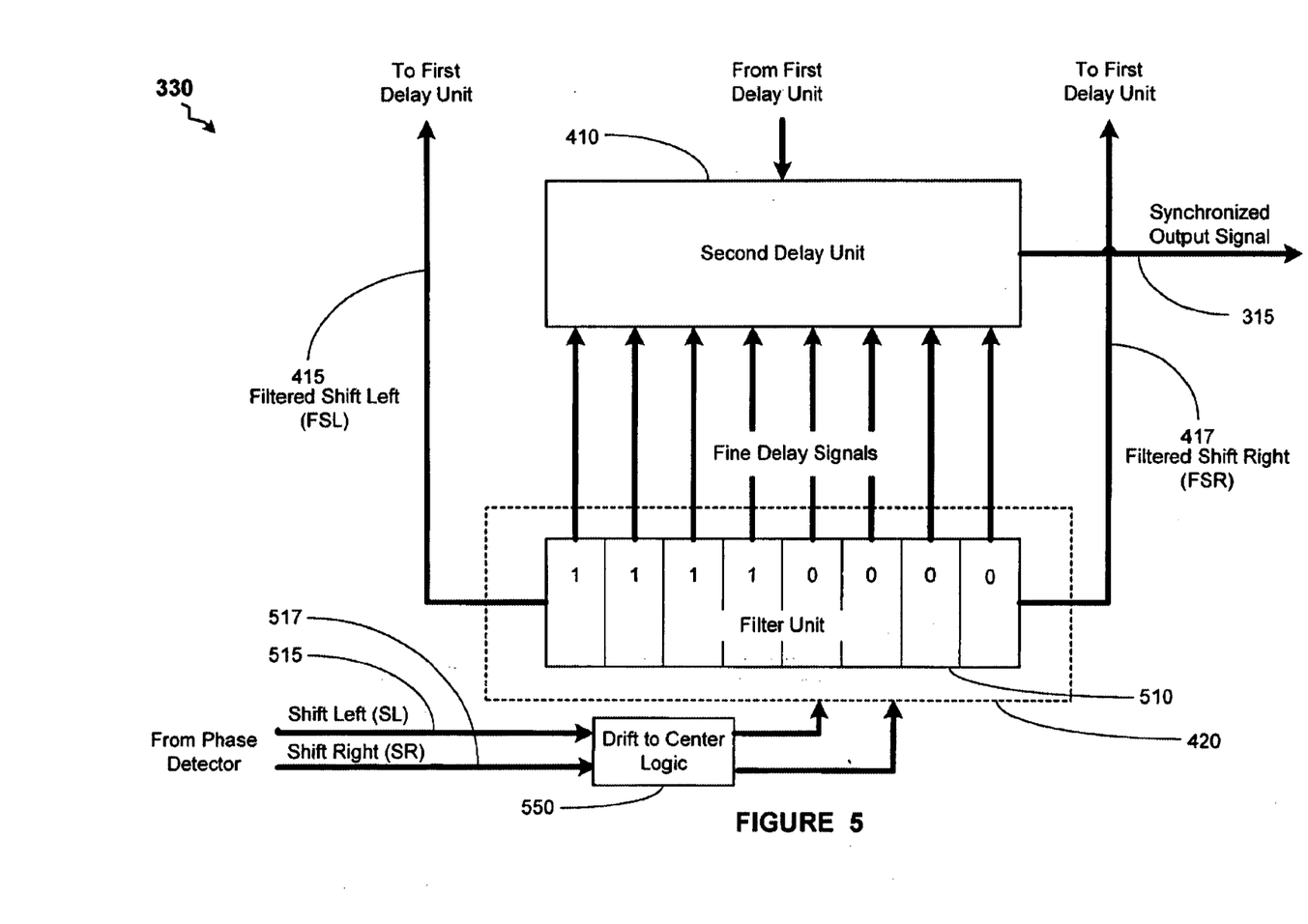
FIG. 5 illustrates a block diagram representation of a first embodiment of a shift-register implementation of the majority filter unit of FIG. 3, in accordance with one illustrative embodiment of the present invention.

Turning now to FIG. 5, a more detailed illustration of the filler unit 420 is provided. The filter unit 420 may comprise a shift register 510. The shift register 510 may be a variety of types of registers, such as an 8 bit register, or a 16 bit register, or any other types of shift register known to those skilled in the art having benefit of the present disclosure. The present embodiment is described within the context of an 8 bit shift register 510, however it is not limited as such. The movements of the shift register 510 are based upon signals from the phase detector 320. The implementation and the movement of the shift register 510 may be implemented by one of a variety of logic implementations known to those skilled in the art having benefit of the present disclosure. The implementation of the shift register 510 may depend upon the desired cutoff frequency of the filter effect of the majority filter unit 330.

The shift register 510 receives a shift left (SL) signal on a line 515 and a shift right (SR) signal on a line 517, which are from the phase detector 320, via a drift to center logic 550. The drift to center logic 550 may modify the assertions of SL 515 and/or SR 517 to cause the filter unit 420 to "move" to the center, thereby helping to ensure that a proper moving average is generated. Assertion of the SL signal 515 may cause the shift register 510 to cause the second delay unit 410 to implement a fine point phase adjustment to the left (i.e., a fine-point positive phase implementation) onto the synchronized output signal on the line 315. Assertion of the SR signal 517 may cause the shift register 510 to cause the second delay unit 410 to implement a fine point phase adjustment to the right (i.e., a fine-point negative phase implementation) onto the synchronized output signal on the line 315.

A predetermined number of assertions of the SL and SR signals on the lines 515, 517 are required before the filter unit 420 (i.e., the shift register 510) asserts the FSR and FSL signals 415, 417, respectively. In other words, after a plurality of fine delay adjustments, a coarse delay adjustment is implemented onto the synchronized output signal on the line 315. In the embodiment illustrated in FIG. 5, four fine delay adjustments are implemented before a coarse adjustment is implemented onto the synchronized output signal on the line 315. More specifically, four fine-point phase adjustments to the right are implemented before a coarse-point phase adjustment to the right is implemented. Likewise four fine point phase adjustments to the left are implemented before a coarse point phase adjustment to the left is implemented. Therefore, a single event, such as noise spike, is prevented from causing a large adjustment on the synchronized output signal on the line 315. In other words, the shift register 510 prevents a coarse delay in response to the SL and/or the SR signals 515, 517, until a predetermined number of pulses on the SR, SL signals 517, 515 are received. To provide a correct moving-average filter function, the filter returns to a center point (zero value) when neither a SR nor SL signal is present.

When the phase detector 320 provides four assertions on the SL signal 515, the FSL signal 415 is asserted indicating a fine delay shift to the left. Similarly, when the phase detector 320 asserts the shift right signal four times, the filter unit 420 asserts the FSR signal on the line 417 indicating a shift to the right. Meanwhile, the second delay unit 410 receives fine point shifts on the assertions of SL and SR signals on the lines 515, 517. The assertions of SL and SR signals 515, 517 may reflect certain events that cause the reference clock (on the line 215) to experience a phase shift as compared to the feedback clock. Utilizing the majority filter unit 330 provided by embodiments of the present invention, an overreaction to certain events causing phase shifts is reduced. Other sizes of shift registers may be used to provide more or less filtering of the SL and the SR signals 515, 517.

Figure 6:
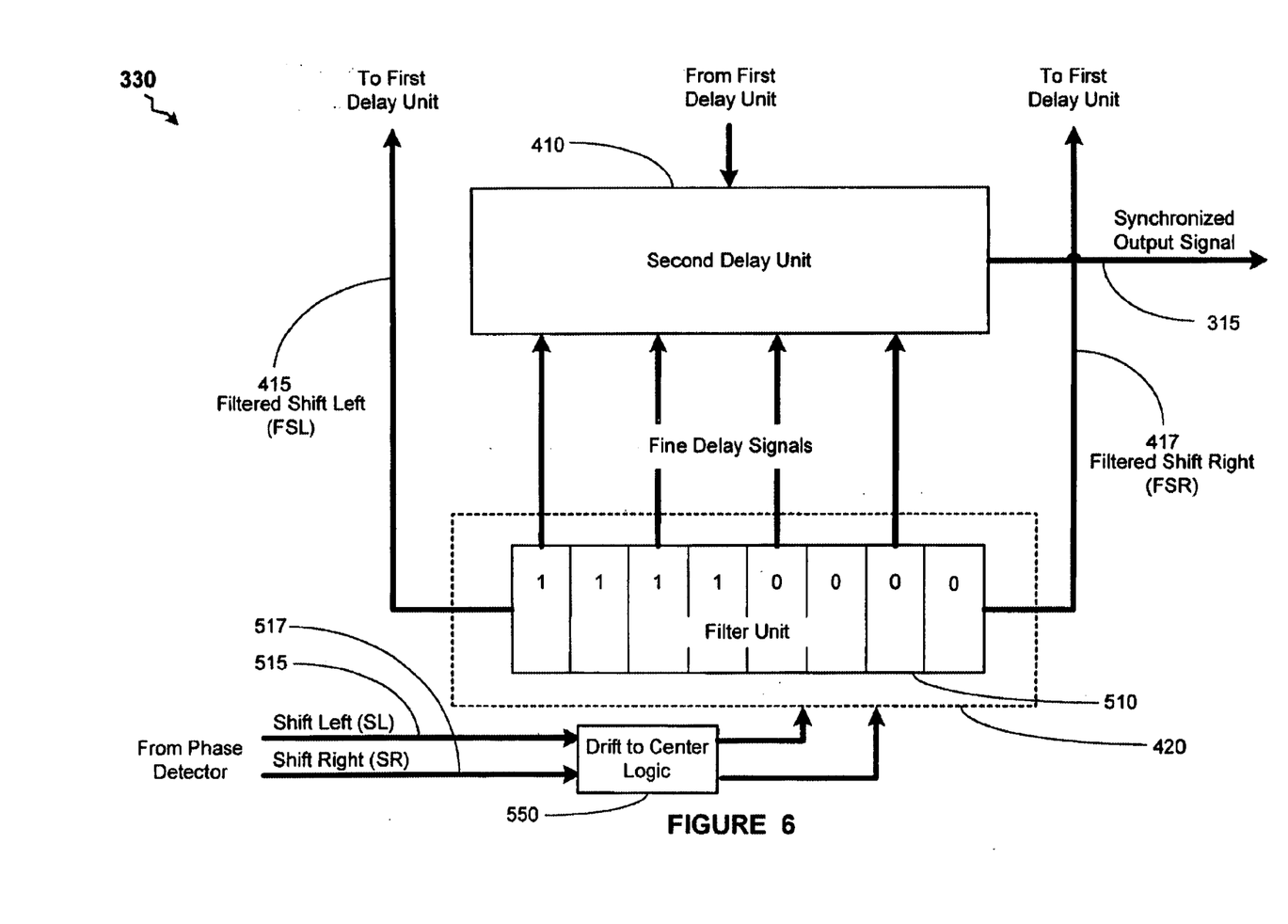
FIG. 6 illustrates a block diagram representation of a second embodiment of a shift-register implementation of the majority filter unit of FIG. 3, in accordance with one illustrative embodiment of the present invention.

Turning now to FIG. 6, an alternative implementation of the shift register 510 in the filter unit 420 is provided. The assertion of the FSL signal 415 and the FSR signal 417 may be implemented in a different manner, as compared to the embodiment of FIG. 5. For example, in one embodiment, the SL signal 515, when asserted, may cause a step in the shift register 510, however, a fine delay signal will not be sent to the second delay unit 410 until two assertions of the SL signal 515. Similarly, the SR signal 517, when asserted twice, will cause the generation of a fine delay signal to be sent from the shift register 510 to the second delay unit 410. Therefore, the SL and the SR signals 515, 517 are filtered even before a fine-point phase adjustment is made by the second delay unit 410. The assertions of the SL and SR signals 515, 517 may be modified by the drift to center logic 550, which may work to move the filter unit 420 to the center, thereby helping to ensure that a proper moving average is generated. The embodiment described above may allow the cutoff frequency for filtering the fine adjustments to differ with respect to the cutoff frequency for the coarse adjustments. The spacing of the fine control lines may set the ratio of fine versus coarse filtering. This spacing may be a design choice, which may be dictated by system specifications and/or the types of noise present in the system 100.

Even though the FSL and the FSR signals 415, 417 are asserted after four assertions of the SL and SR signals 515, 517, respectively, the fine delay adjustments are made with slightly more granularity than the fine delay signals described in FIG. 5. Therefore, the operation of the filtering effect of the filter unit 420 may be controlled by manipulating the operation of the shift register 510. Once the FSL and the FSR signals 415, 417 are asserted, the majority filter unit 330 is reset. More specifically, with the assertion of FSL and FSR 415, 417, the position of the shift register 510 is reset to a start position where four more shifts are required for a coarse delay adjustment assertion.

Figure 7:
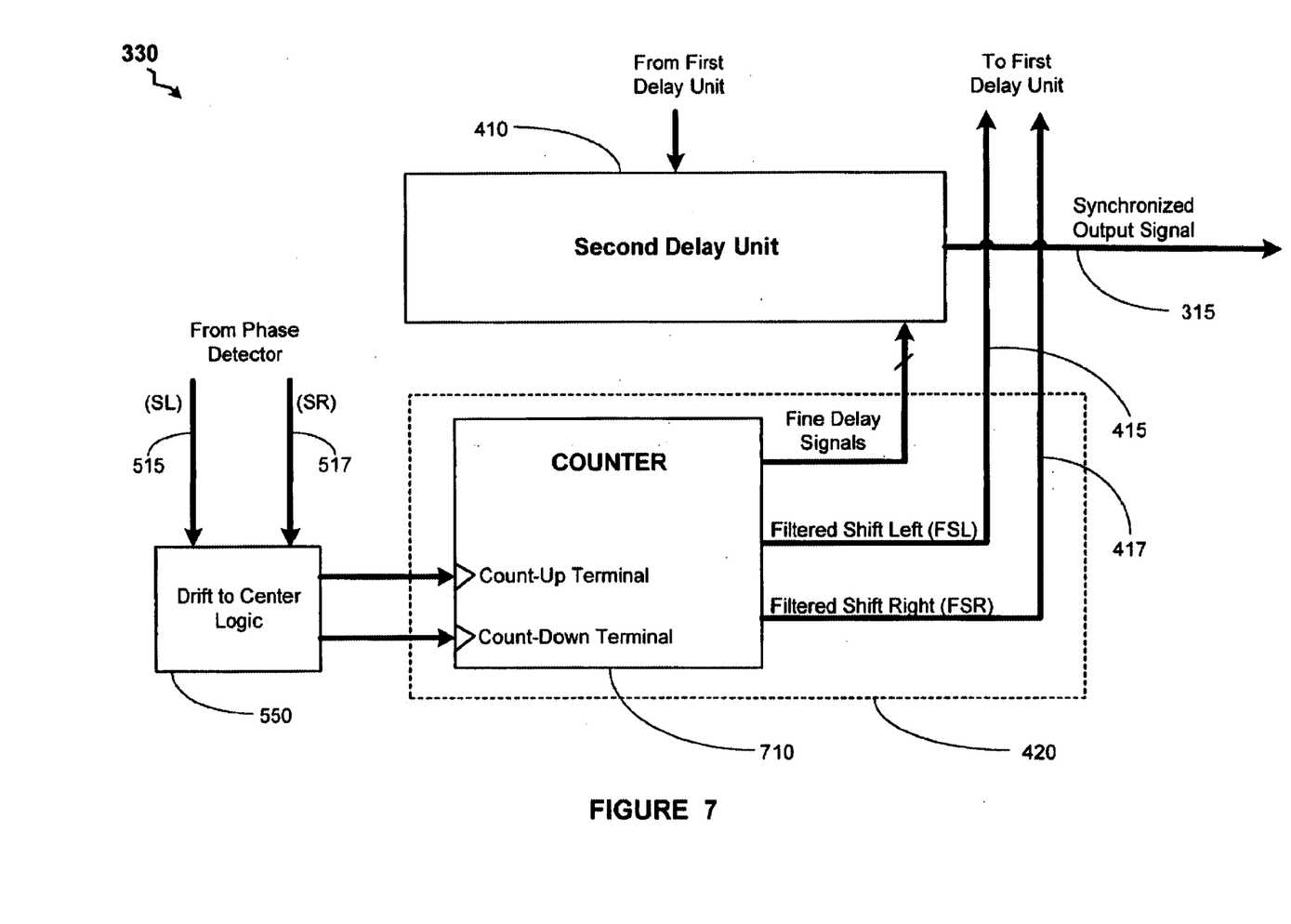
FIG. 7 illustrates a block diagram representation of a counter implementation of the majority filter unit of FIG. 3, in accordance with one illustrative embodiment of the present invention.

Turning now to FIG. 7, an alternative embodiment of the implementation of the majority filter unit 330 is provided. In the embodiment depicted in FIG. 7, the filter unit 420 comprises a counter 710 for asserting the FSL and FSR signals 415, 417. The counter 710 comprises a count-up terminal and a count-down terminal. The SL signal 515 is positioned to drive the count-up terminal and the SR signal 517 is positioned to drive the count-down terminal. Based upon consecutive or cumulative assertions of the SL signal 515, the counter 710 is incremented to a predetermined level upon which an assertion of the FSL 415 will take place. The fine-point phase adjustments described above are implemented based upon assertions of signals detected via the count-up and count-down terminals. When neither SL nor SR signals are asserted, the counter may drift back to a center position to help ensure that a moving average is calculated. This is useful in creating the low-pass filter function. The assertions SL and SR signals 515, 517 may be modified by the drift to center logic 550 to cause the filter unit 420 containing the counter 710 to drift to the center, thereby helping to ensure that a proper moving average is generated.

In one embodiment, upon every signal-assertion detected by the count-up terminal, a fine-point positive correction is implemented by the second delay unit 410. Additionally, upon every signal-assertion detected by the count-down terminal, a fine-point negative correction is implemented by the second delay unit 410. In an alternative embodiment, every other signal-assertions detected by the count-up and/or count-down terminals may prompt a fine delay adjustment.

The counter 710 may be programmed in a variety of configurations for prompting a coarse-point adjustment (i.e., an assertion of the FSL or the FSR signals 415, 417) based upon a predetermined number of count-up and count-down assertions (i.e., assertions of the SL and/or the SR signals 515, 517) detected. For example, the counter 710 may be programmed to react when four SL signal 515 assertions (i.e., when the count in the counter 710 reaches four because of the incrementing of SL signal 515), and thereby asserting the FSL signal 415, prompting a coarse-point positive adjustment. Similarly, the SR signal 417 may count down to a predetermined level, which, if reached, the counter 710 will assert the FSR signal 417, prompting a coarse-point negative phase adjustment. Meanwhile, a count number may also be sent to the second delay unit 410 representing a fine delay signal. Similar to the usage of the shift register 510, the counter 710 may be adjusted such that every other count will assert a fine delay. The counter 710 provides a versatile filter, which may be adjusted to numerous predetermined count values for the assertion of the FSL and FSR signals 415,417.

Figure 8:
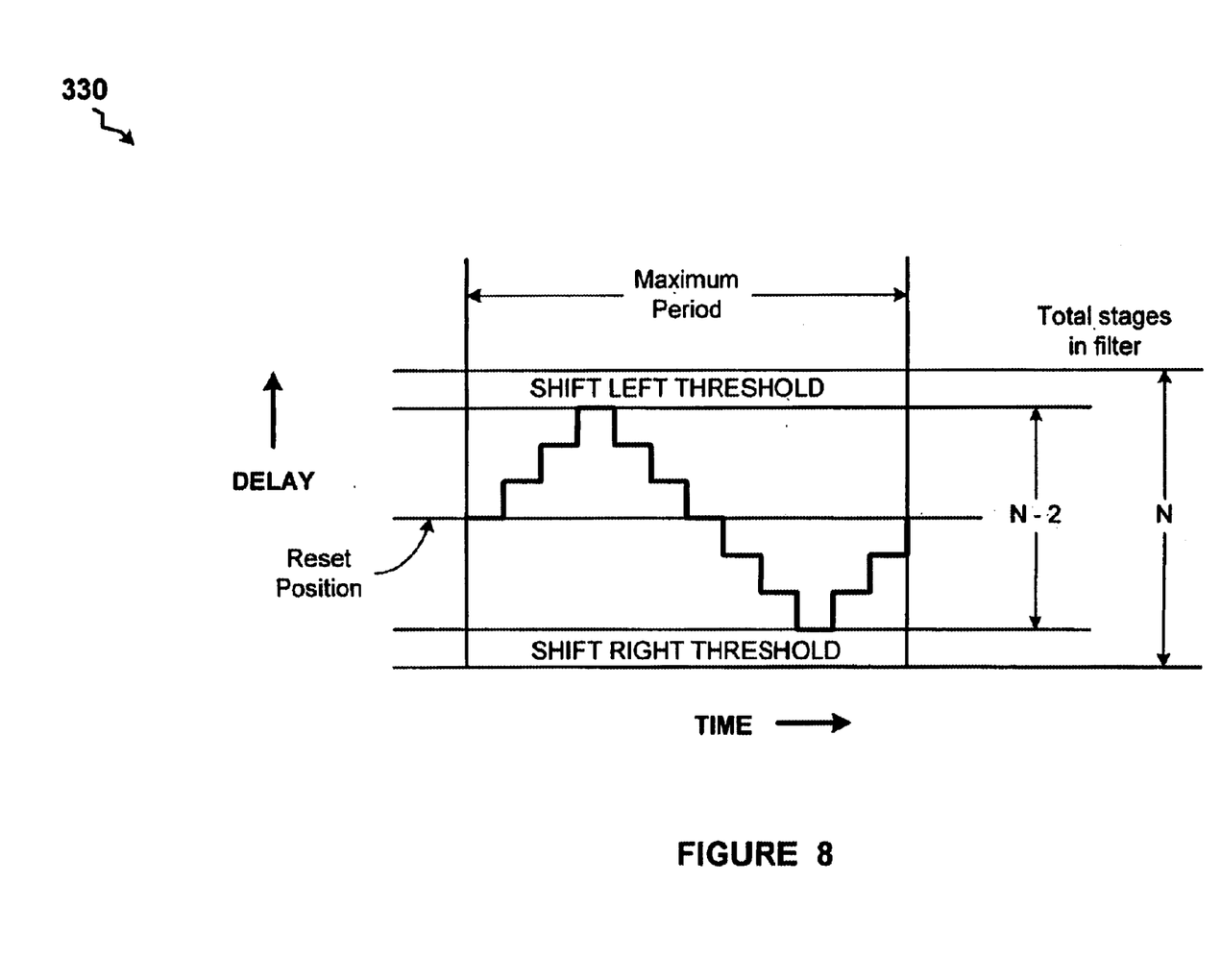
FIG. 8 illustrates a graphical representation of the operation of a majority filter of FIG. 3, in accordance with one illustrative embodiment of the present invention.

Turning now to FIG. 8, a graphical representation of the operation of the majority filter unit 330 is illustrated. At each increment of time, a fine-point phase shift to the left or to the right is made. When there is neither a shift left or right (i.e., the phase is equal, as detected by the phase detector 320), the filter position drifts towards the center of the graph. In one embodiment, the majority filter unit 330 comprises a logic circuitry to cause the drift towards the center. Each step shown in FIG. 8 moves toward a shift left threshold, which when reached, causes an assertion of the FSL signal 415, or towards a shift right threshold, which causes an assertion of the FSR signal 417.

The majority filter unit 330 computes a moving average of the motion towards the shift-left and the shift-right thresholds. If the average number of shifts (left or right shifts) reaches the threshold, a qualified shift is created, and the average is reset to zero. The low-pass filter effect of the majority filter unit 330 may be defined by a cutoff frequency, $f_c$. The low-pass cutoff frequency, $f_c$ of the majority filter unit 330 may be determined by the maximum period that may be maintained within the shift register 510 without triggering a qualified shift (see FIG. 8). The low-pass cutoff frequency, $f_c$ of the majority filter unit 330 may be defined by Equation 1:

$$f_c = 1/[2(N-2)^*t_{ck}]; \quad \text{Equation 1}$$

where N is the total stages in the filter implemented by the filter unit 420 (see FIG. 8) and $t_{ck}$ is the period of the reference clock. The cutoff frequency of the low pass filter implemented by the majority filter unit 330 may be determined by the width of the shift register 510. Using the shift register 510 or the counter 710, the ability of the delay lock loop circuit 230 to implement different amounts of majority filtering for coarse delay is provided.

Although the coarse delay motion is filtered, the fine motion may also be filtered, depending on the spacing of fine control (see FIG. 6). Even though the coarse motion may be dampened, the smaller changes in delay given by the fine steps may be enough to satisfy the phase detector 310 and prevent the coarse movement altogether. Furthermore, the phase detector 320 is capable of distinguishing phase variations at least as small as the fine delay steps.

Figures 9A, 9B, 9C:
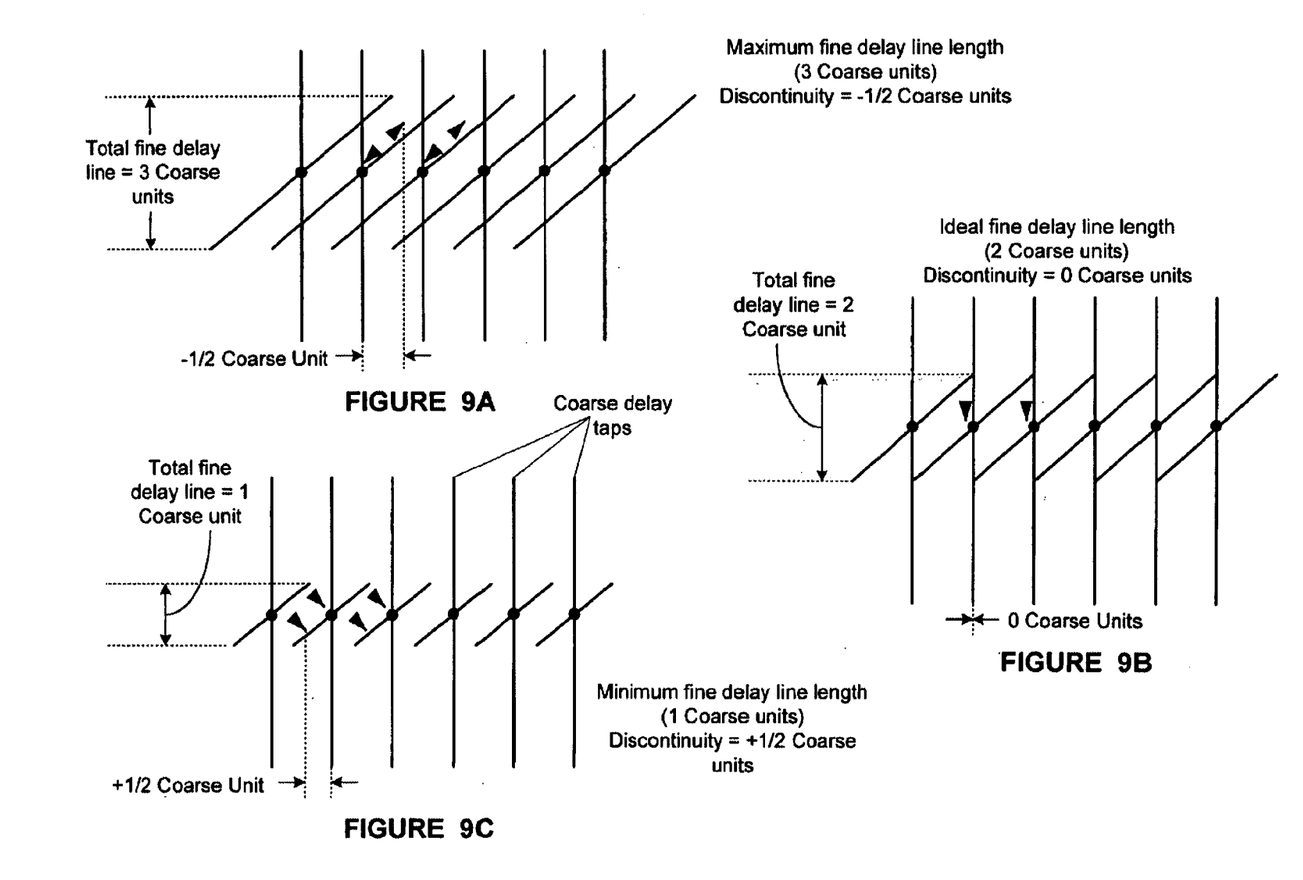
FIGS. 9A, 9B, and 9C illustrate a graphical representation of various relationships between a coarse delay and a fine delay adjustment of a digital signal, in accordance with one illustrative embodiment of the present invention.

Turning now to FIGS. 9A, 9B, and 9C, a graphic illustration of the relationship between the coarse delay and the fine delay is provided. In one embodiment, to ensure that no more than a half coarse-unit delay discontinuity occurs as the fine delay line overflows and causes a coarse delay shift to occur, the total fine delay line length may be set between one coarse-unit delay and three coarse-unit delays. FIGS. 9A, 9B and 9C illustrate the resultant discontinuity that occurs as the fine delay goes to an end (i.e., the count goes to the predetermined maximum in a counter 710 or maximum shift of bits in a shift register 510), and the majority filter unit 330 resets to the center and causes a coarse shift delay to occur.

In one embodiment, the ideal total fine delay is two coarse-unit delays. The FIGS. 9A, 9B and 9C illustrate coarse delay taps that are represented by vertical lines and fine delay lines that are represented by slanted lines. FIG. 9A illustrates a maximum fine delay length, which is equal to three coarse delays, therefore, a discontinuity of a minus ½ coarse-unit delay exists. In FIG. 9C, the minimum fine delay line length is equal to one coarse delay and the discontinuity is equal to a plus ½ coarse-unit delay. The ideal fine delay line length is equal to two coarse-units, and therefore, the discontinuity is a zero coarse-unit delay as illustrated in FIG. 9B. In FIG. 9B, the delay lines shift such that there is no discontinuity.

The length of the fine delay line is the total delay through the delay line from minimum to maximum. It may be difficult to set an independent fine delay line to be exactly two coarse lengths, but as long as this range of one to three is met, as represented by FIGS. 9A, 9B, and 9C, the instantaneous discontinuity will generally be no larger than a ½ coarse delay. In many applications, the ½ coarse-unit delay may be an acceptable margin of error. Setting the total fine length involves the determination of the total number of stages as well as how many coarse delay taps in the majority filter would cause a fine shift to occur as described above. In one embodiment, the majority filter implementation may be dictated by the above limitations in fine-to-coarse delay discontinuity and the selection of fine-to-coarse filtering ratios (determined by the spacing of the fine control as shown in FIG. 6).

Utilizing embodiments of the present invention, a qualified shift signal may be generated to implement more accurate delays to produce a synchronized output signal. Access to memory devices generally requires accurate digital signals to ensure that proper data is placed and/or retrieved to and from the memory. Utilizing embodiments of the present invention, a delay locked loop circuit 230 is provided such that a noise spike in the digital signals may not be tracked and thereby preventing the noise spike from disrupting the operation of the delay lock loop circuit 230. The present invention provides for improved access of memory resulting from the improved operation of the delay lock loop. The delay lock loop circuit 230 described by embodiments of the present invention may be implemented into a variety of electronic circuits. The teachings of the present invention may be implemented on a plurality of types of memory devices, such as flash memory, DRAM memory, other volatile and/or non-volatile memory devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   delay lock loop to provide an output signal based upon a phase difference between a reference signal and a feedback signal, said delay lock loop comprising a filter to provide a filter response to a said phase difference, said filter response providing at least one of a coarse delay and an adaptive fine delay, said adaptive fine delay being capable of providing at least one of a plurality of fine delays based upon a moving average filter.

2. The device of claim 1, wherein said device is a memory device.

3. The device of claim 2, wherein said memory device is at least one of a static random access memory (SRAM), a dynamic random access memory (DRAM), a double-data rate SDRAM (DDR SDRAM), a Rambus DRAM (RDRAM), and a FLASH memory.

4. The device of claim 1, wherein said delay lock loop further comprises:
   a first delay unit within said filter, said first delay unit to provide said coarse delay upon said reference signal;
   a phase detector to recognize said phase difference; and
   a feedback delay unit to provide a delay upon said output signal to generate said feedback signal.

5. The device of claim 1, wherein said filter to generate said coarse delay is based upon a plurality of fine delays.

6. The device of claim 1, wherein said filter comprises:
   a filter unit to filter said phase difference to produce at least one signal relating to said fine delay and at least one signal relating to said coarse delay; and
   a second delay unit to implement said fine delay upon said reference signal to produce said output signal.

7. The device of claim 1, wherein said filter unit further comprises a shift register to generate at least one of a shift left fine signal, a shift right fine signal, a filtered shift left signal, and a filtered shift right signal.

8. The device of claim 7, wherein said filter unit being further adapted to vary a ratio relating to said fine delay and said coarse delay based upon an interval relating to said shift register.

9. The device of claim 1, wherein said filter unit further comprises a counter to generate at least one of a shift left fine signal, a shift right fine signal, a filtered shift left signal, and a filtered shift right signal.

10. The device of claim 9, wherein said filter unit being further adapted to vary a ratio relating to said fine delay and said coarse delay based upon an interval relating to said counter.

11. The device of claim 8, wherein said coarse delay is based upon at least one of said filtered shift left signal, and said filtered shift right signal.

12. The device of claim 1, wherein said output signal comprises said coarse delay and said fine delay.

13. The device of claim 1, wherein said reference signal is a clock signal.

14. A delay lock loop, comprising:
   a forward path comprising an input path for receiving a reference signal and a delay path for providing at least one of a coarse delay and a fine delay upon said reference signal to provide an output signal;
   a feedback path to provide a feedback signal based upon said output signal;
   a phase detector to generate a shift signal based upon a phase comparison of said feedback signal and said reference signal; and
   a filter to receive said shift signal from said phase detector and provide at least one of an adaptive fine delay signal and a coarse delay signal for generating said output signal, said adaptive fine delay being capable of providing at least one of a plurality of fine delays based upon a moving average filter.

15. The delay lock loop of claim 14, wherein said forward path comprising a first delay unit for implementing a coarse delay upon said reference signal.

16. The delay lock loop of claim 14, wherein said feedback path comprising a feedback delay unit to implement a feedback delay upon said output signal to generate said feedback signal.

17. The delay lock loop of claim 14, wherein said filter comprises a shift register to generate at least one of a shift left fine signal, a shift right fine signal, a filtered shift left signal, and a filtered shift right signal.

18. The delay lock loop of claim 17, wherein said filter unit being further adapted to vary a ratio relating to said fine delay and said coarse delay based upon an interval relating to said shift register.

19. The delay lock loop of claim 14, wherein said filter comprises a counter to generate at least one of a shift left fine signal, a shift right fine signal, a filtered shift left signal, and a filtered shift right signal.

20. The delay lock loop of claim 19, wherein said filter unit being further adapted to vary a ratio relating to said fine delay and said coarse delay based upon an interval relating to said counter.

21. The delay lock loop of claim 19, wherein said coarse delay signal is based upon at least one of said filtered shift left signal, and said filtered shift right signal.

22. The delay lock loop of claim 21, wherein said output signal comprises a coarse delay defined by said coarse delay signal and said fine delay defined by at least one of said shift left fine signal and said shift right fine signal.

23. The delay lock loop of claim 16, wherein said reference signal is a clock signal.

24. A circuit, comprising:
   a first delay unit to receive a reference signal and provide a delay upon said reference signal;
   a filter to apply a second delay upon said reference signal to generate an output signal; said second delay being an adaptive fine delay, said adaptive fine delay being capable of providing at least one of a plurality of fine delays based upon a moving average filter;
   a feedback delay unit to provide a delay upon said output signal to generate a feedback signal; and
   a phase detector to determine a phase difference between said reference signal and said feedback signal and generate a shift signal.

25. The circuit of claim 24, wherein said filter comprises a shift register to generate at least one of a shift left fine signal, a shift right fine signal, a filtered shift left signal, and a filtered shift right signal based upon said shift signal.

26. The circuit of claim 25, wherein said filter being further adapted to vary a ratio relating to said fine delay and said coarse delay based upon an interval relating to said shift register.

27. The circuit of claim 24, wherein said filter comprises a counter to generate at least one of a shift left fine signal, a shift right fine signal, a filtered shift left signal, and a filtered shift right signal based upon said shift signal.

28. The circuit of claim 27, wherein said filter being further adapted to vary a ratio relating to said fine delay and said coarse delay based upon an interval relating to said counter.

29. The circuit of claim 27, wherein said coarse delay signal is based upon at least one of said filtered shift left signal, and said filtered shift right signal.

30. The circuit of claim 27, wherein said output signal comprises a coarse delay defined by said coarse delay signal and said fine delay defined by at least one of said shift left fine signal and said shift right fine signal.

31. The circuit of claim 24, wherein said reference signal is a clock signal.

32. A system board, comprising:
   a first device comprising a memory location for storing data and a delay lock loop to provide an output signal based upon a phase difference between a reference signal and a feedback signal, said delay lock loop comprising a filter to provide a filter response to a said phase difference, said filter response comprising providing at least one of a coarse delay and an adaptive fine delay, said adaptive fine delay being capable of providing at least one of a plurality of fine delays based upon a moving average filter; and
   a second device operatively coupled to said first device, said second device to access data from said first device based upon an operation performed by said delay lock loop.

33. The system board described in claim 32, wherein said memory location is at least one of an SRAM, a DRAM, a DDR SDRAM, a RDRAM, and a FLASH memory.

34. The system board of claim 32, wherein said system board is a motherboard of a computer system.

35. The system board of claim 32, wherein said forward path comprising a first delay unit for implementing a coarse delay upon said reference signal.

36. The system board of claim 32, wherein said feedback path comprising a feedback delay unit to implement a feedback delay upon said output signal to generate said feedback signal.

37. The system board of claim 32, wherein said filter comprises a shift register to generate at least one of a shift left fine signal, a shift right fine signal, a filtered shift left signal, and a filtered shift right signal.

38. The system board of claim 37, wherein said filter being further adapted to vary a ratio relating to said fine delay and said coarse delay based upon an interval relating to said shift register.

39. The system board of claim 32, wherein said filter comprises a counter to generate at least one of a shift left fine signal, a shift right fine signal, a filtered shift left signal, and a filtered shift right signal.

40. The system board of claim 39, wherein said filter being further adapted to vary a ratio relating to said fine delay and said coarse delay based upon an interval relating to said counter.

41. The system board of claim 39, wherein said coarse delay signal is based upon at least one of said filtered shift left signal, and said filtered shift right signal.

42. The system board of claim 39, wherein said output signal comprises a coarse delay defined by said coarse delay signal and said fine delay defined by at least one of said shift left fine signal and said shift right fine signal.

43. A memory device, comprising:
delay lock loop to provide an output signal based upon a phase difference between a reference signal and a feedback signal, said delay lock loop comprising a filter to provide a filter response to a said phase difference, said filter response comprising providing at least one of a coarse delay and an adaptive fine delay, said adaptive fine delay being capable of providing at least one of a plurality of fine delays based upon a moving average filter.

44. The memory device of claim 43, wherein said memory device is at least one of a static random access memory (SRAM), a dynamic random access memory (DRAM), a double-data rate SDRAM (DDR SDRAM), a Rambus DRAM (RDRAM), and a FLASH memory.

45. The memory device of claim 43, wherein said delay lock loop further comprises:
a first delay unit to provide said coarse delay upon said reference signal;
a phase detector to provide said phase difference; and
a feedback delay unit to provide a delay upon said output signal to generate said feedback signal.

46. The memory device of claim 43, wherein said filter to generate said coarse delay based upon a plurality of fine delays.

47. The memory device of claim 43, wherein said filter comprises:
a filter unit to filter said phase difference to produce at least one signal relating to said fine delay and at least one signal relating to said coarse delay; and
a second delay unit to implement said fine delay upon said reference signal to produce said output signal.

48. The memory device of claim 43, wherein said filter unit further comprises a shift register to generate at least one of a shift left fine signal, a shift right fine signal, a filtered shift left signal, and a filtered shift right signal.

49. The memory device of claim 48, wherein said filter unit being further adapted to vary a ratio relating to said fine delay and said coarse delay based upon an interval relating to said shift register.

50. The memory device of claim 43, wherein said filter unit further comprises a counter to generate at least one of a shift left fine signal, a shift right fine signal, a filtered shift left signal, and a filtered shift right signal.

51. The memory device of claim 50, wherein said filter unit being further adapted to vary a ratio relating to said fine delay and said coarse delay based upon an interval relating to said counter.

52. The memory device of claim 50, wherein said coarse delay is based upon at least one of said filtered shift left signal, and said filtered shift right signal.

53. The memory device of claim 43, wherein said output signal comprises said coarse delay and said fine delay.

54. A method, comprising:
providing at least one of a coarse delay and an adaptive fine delay upon a reference signal based upon a phase shift between said reference signal and a feedback signal, providing said adaptive fine delay comprises providing at least one of a plurality of fine delays based upon a moving average filter; and
generating a synchronized output signal based upon said coarse delay and said fine delay.

55. The method of claim 54, wherein providing said coarse delay further comprises filtering a signal relating to said phase shift.

56. The method of claim 54, wherein providing said coarse delay further comprises using a shift register to generate at least one of a shift left fine signal and a shift right fine signal based upon said phase shift.

57. The method of claim 56, further comprising varying a ratio relating to said fine delay and said coarse delay based upon an interval relating to said shift register.

58. The method of claim 54, wherein providing said fine delay further comprises using a shift register to generate at least one of a filtered shift left signal, and a filtered shift right signal.

59. An apparatus, comprising:
means for providing at least one of a coarse delay and an adaptive fine delay upon a reference signal based upon a phase shift between said reference signal and a feedback signal, means for providing said adaptive fine delay comprises means for providing at least one of a plurality of fine delays based upon a moving average filter; and
means for generating a synchronized output signal based upon said coarse delay and said fine delay, said means for generating said synchronized output signal comprising means for controlling said coarse and said fine delay.

60. A computer readable program storage device encoded with instructions that, when executed by a computer, performs a method, comprising:
providing at least one of a coarse delay and an adaptive fine delay upon a reference signal based upon a phase shift between said reference signal and a feedback signal, providing said adaptive fine delay comprises providing at least one of a plurality of fine delays based upon a moving average filter; and
generating a synchronized output signal based upon said coarse delay and said fine delay.

61. The computer readable program storage device encoded with instructions that, when executed by a computer, performs the method of claim 60, wherein providing said coarse delay further comprises filtering a signal relating to said phase shift.

62. The computer readable program storage device encoded with instructions that, when executed by a computer, performs the method of claim 60, wherein providing said coarse delay further comprises using a shift register to generate at least one of a shift left fine signal and a shift right fine signal based upon said phase shift.

63. The computer readable program storage device encoded with instructions that, when executed by a computer, performs the method of claim 62, the method further comprising varying a ratio relating to said fine delay and said coarse delay based upon an interval relating to said shift register.

64. The computer readable program storage device encoded with instructions that, when executed by a computer, performs the method of claim 60, wherein providing said fine delay further comprises using a shift register to generate at least one of a filtered shift left signal, and a filtered shift right signal.

* * * * *

UNITED STATES PATENT AND TRADEMARK OFFICE
CERTIFICATE OF CORRECTION

PATENT NO. : 6,728,163 B2
DATED : April 27, 2004
INVENTOR(S) : Tyler J. Gomm and Ross E. Dermott It is certified that error appears in the above-identified patent and that said Letters Patent is hereby corrected as shown below:

Column 1,
Line 11, replace "Modem" with -- Modern --.
Line 28, replace "selection" with -- selecting --.
Line 62, replace "modem"with -- modern --.

Column 2,
Line 16, replace "memory, unit" with -- memory unit --.

Column 3,
Lines 51, 54, 57 and 60, replace ":" with -- ; --.

Column 5,
Line 23, replace "he" with -- be --.
Line 41, replace "embodiment;" with -- embodiment,--.

Column 6,
Line 36, replace "Of" with -- of --.

Column 7,
Line 6, replace "maybe" with -- may be --.
Line 62, replace "delay:" with -- delay; --.

Column 8,
Line 28, replace "filler" with -- filter --.

Signed and Sealed this

Twenty-third Day of November, 2004

JON W. DUDAS
*Director of the United States Patent and Trademark Office*